(12) United States Patent
Spengler

(10) Patent No.: US 7,544,070 B2
(45) Date of Patent: Jun. 9, 2009

(54) ELECTRICAL CONNECTOR DEFINING A POWER PLANE

(75) Inventor: David Louis Spengler, Colorado Springs, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 724 days.

(21) Appl. No.: 10/884,330

(22) Filed: Jul. 2, 2004

(65) Prior Publication Data

US 2006/0003612 A1 Jan. 5, 2006

(51) Int. Cl.
*H01R 13/648* (2006.01)
(52) U.S. Cl. .................................... 439/101; 439/108
(58) Field of Classification Search ................. 439/101, 439/108; 361/794, 780, 777, 788, 785; 174/255, 174/262
See application file for complete search history.

(56) References Cited

U.S. PATENT DOCUMENTS

| | | | |
|---|---|---|---|
| 3,405,227 A * | 10/1968 | Hazlett | .......................... 174/252 |
| 4,090,764 A | 5/1978 | Malsby et al. | |
| 4,582,374 A | 4/1986 | Conrad et al. | |
| 4,755,147 A | 7/1988 | Young | |
| 4,762,500 A | 8/1988 | Dola et al. | |
| 4,819,131 A | 4/1989 | Watari | |
| 4,867,690 A | 9/1989 | Thumma | |
| 4,898,545 A | 2/1990 | Endo et al. | |
| 4,926,376 A | 5/1990 | Rosini | |
| 5,012,389 A | 4/1991 | Perry | |
| 5,066,831 A | 11/1991 | Spielberger et al. | |
| D366,454 S | 1/1996 | Eaton | |
| 5,501,612 A | 3/1996 | Green | |
| 5,575,690 A | 11/1996 | Eaton | |
| 5,763,947 A | 6/1998 | Bartley | |
| 5,816,829 A | 10/1998 | Chiang | |
| 5,825,084 A | 10/1998 | Lau et al. | |
| 6,059,615 A | 5/2000 | Pendleton et al. | |
| 6,287,132 B1 * | 9/2001 | Perino et al. | ................. 439/108 |
| 6,439,895 B1 | 8/2002 | Li | |
| 6,462,956 B1 | 10/2002 | Herrell et al. | |
| 6,558,181 B2 * | 5/2003 | Chung et al. | ................. 439/342 |
| 6,653,726 B1 | 11/2003 | Schultz et al. | |
| 6,727,435 B1 * | 4/2004 | Egan et al. | ................... 174/250 |
| 6,750,405 B1 | 6/2004 | Fallon et al. | |
| 6,772,050 B2 | 8/2004 | Williams et al. | |
| 2001/0023144 A1 | 9/2001 | Shepherd | |
| 2002/0180456 A1 | 12/2002 | Ta et al. | |
| 2003/0027462 A1 | 2/2003 | Winings | |
| 2003/0223208 A1 | 12/2003 | Wu et al. | |
| 2004/0016569 A1 | 1/2004 | Mix et al. | |
| 2004/0100780 A1 * | 5/2004 | Stone et al. | ................. 361/760 |

FOREIGN PATENT DOCUMENTS

| | | |
|---|---|---|
| EP | 0347097 A1 | 12/1989 |
| JP | 10135671 A2 | 5/1998 |

* cited by examiner

*Primary Examiner*—Briggitte R Hammond
*Assistant Examiner*—Vanessa Girardi
(74) *Attorney, Agent, or Firm*—Fellers, Snider, et al.

(57) ABSTRACT

An electronics cabinet is provided comprising an electrical connector in electrical communication with a printed circuit board (PCB) comprising a PCB power plane, the connector comprising a plurality of power contacts defining a connector power plane adapted for receiving a substantially even power load distribution from the PCB power plane among the power contacts.

8 Claims, 7 Drawing Sheets

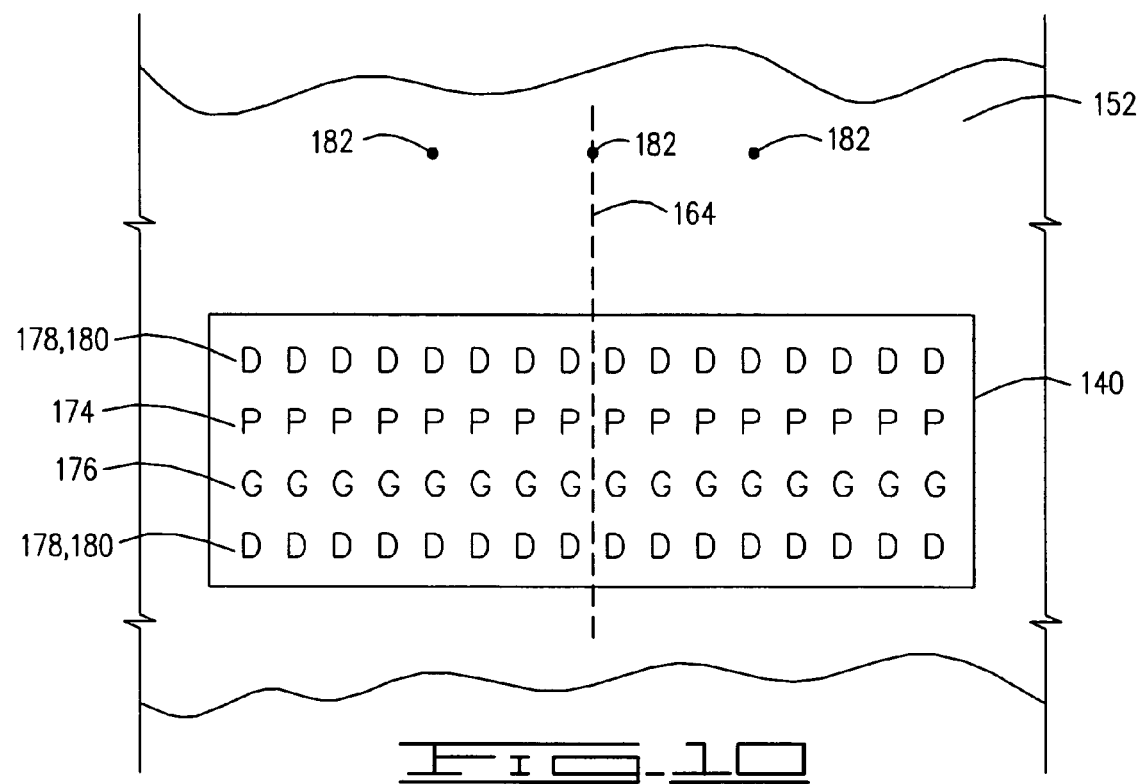

ELECTRICAL CONNECTOR DEFINING A POWER PLANE

FIELD OF THE INVENTION

The embodiments of the present invention relate generally to the field of electronics systems and more particularly but without limitation to a connector defining a power plane that is connectable to the power plane of a printed circuit board.

BACKGROUND

Ever-increasing demand for data storage capacity has fostered the development of improved data array storage systems wherein a plurality of data storage devices are electronically linked to function synergistically. Data integrity schemes are also enhanced in such arrays permitting fail-safe redundant storage of data, such as in redundant arrays of independent device ("RAID") systems.

There are a number of challenges facing the array designer. For example, the many and complex mechanical and electrical connections required for each data storage device are multiplied by the number in an array. That is, each and every data storage device requires sufficient mechanical support to isolate the delicate head and disc components from vibration levels that create data transfer errors. Not only must attention be paid to self-excitation, that is, vibration caused by the rotating disc of a data storage device itself, but like attention is required to external excitation sources in such an environment. External excitation can come from other data storage devices in the array, electrical components in the array such as power supplies and fans, and from the installation and/or removal of data storage devices while the array is operational.

As the number of data storage devices in arrays increases, the problems associated with electromagnetic interference containment are exacerbated as well. Properly shielding the data storage devices requires attention paid not only to leakage paths between drives in adjacent shelves, but also to the leakage paths potentially created by the multiple openings into which each of the plurality of data storage devices is inserted. Adequate shielding of these openings must be provided while still permitting the ability to insert and/or remove a data storage device without disrupting the shielding in place for adjacent data storage devices in the array.

Flexibility can be a problem as well. For instance, traditionally the electrical systems, such as the connector boards, controllers, and connecting buses, are hard-wired for a pre-determined number and size of data storage devices in the array. This is required to maintain the electrical integrity of the array while permitting swapping of individual data storage devices. For this reason, the storage shelves and the associated electrical systems are dedicated for the predetermined number and size of data storage devices. Accordingly, because of both mechanical and electrical constraints, an array designed for a particular form factor configuration cannot readily be adapted for use with a different form factor. Also, if a grouping of data storage devices is needed for a particular function, such as mirroring the storage of data, such functionality must conventionally be achieved at the top level host programming level. This requires complex and coordinated programming of many data storage devices.

While various approaches have been proposed in the art to address maximizing the data storage capacity while also providing operable flexibility in the utilization of data storage devices in array storage systems, there nevertheless remains a continued need for improvements in the art. It is to such improvements that the claimed invention is directed.

SUMMARY OF THE INVENTION

In accordance with preferred embodiments of the present invention, an apparatus is contemplated for defining a power plane in a connector portion of an electronic circuit.

In some preferred embodiments an electronics cabinet is provided comprising an electrical connector in electrical communication with a printed circuit board (PCB) comprising a PCB power plane, the connector comprising a plurality of power contacts defining a connector power plane adapted for receiving a substantially even power load distribution from the PCB power plane among the power contacts.

In some embodiments an electronic module is provided comprising an electronic connector adapted for electrically communicating with a PCB comprising a PCB power plane, the connector comprising a plurality of power contacts defining a connector power plane adapted for receiving a substantially even power load distribution from the PCB power plane among the power contacts.

In some embodiments an electrical connector is provided that is adapted for electrically communicating with a PCB comprising a PCB power plane, the connector comprising a plurality of power contacts defining a connector power plane adapted for receiving a substantially even power load distribution from the PCB power plane among the power contacts.

These and various other features and advantages which characterize the claimed invention will become apparent upon reading the following detailed description and upon reviewing the associated drawings.

BRIEF DESCRIPTION OF THE DRAWINGS

FIGS. 8-10 are diagrammatic views similar to FIG. 7 but of a connector constructed in accordance with embodiments of the present invention.

DETAILED DESCRIPTION

Figure 1:
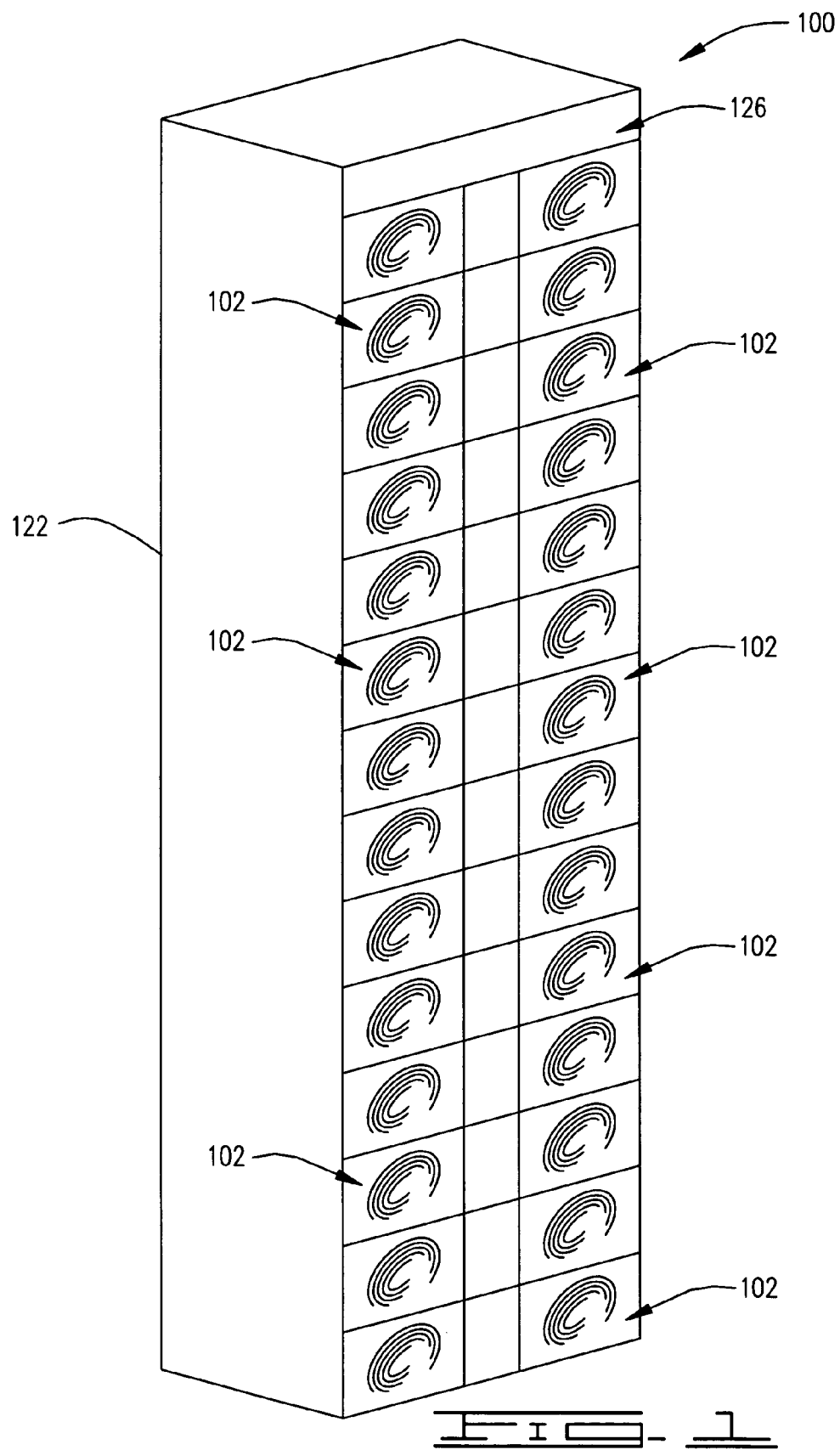
FIG. 1 is an isometric view of an array storage system constructed in accordance with embodiments of the present invention.
Figure 2:
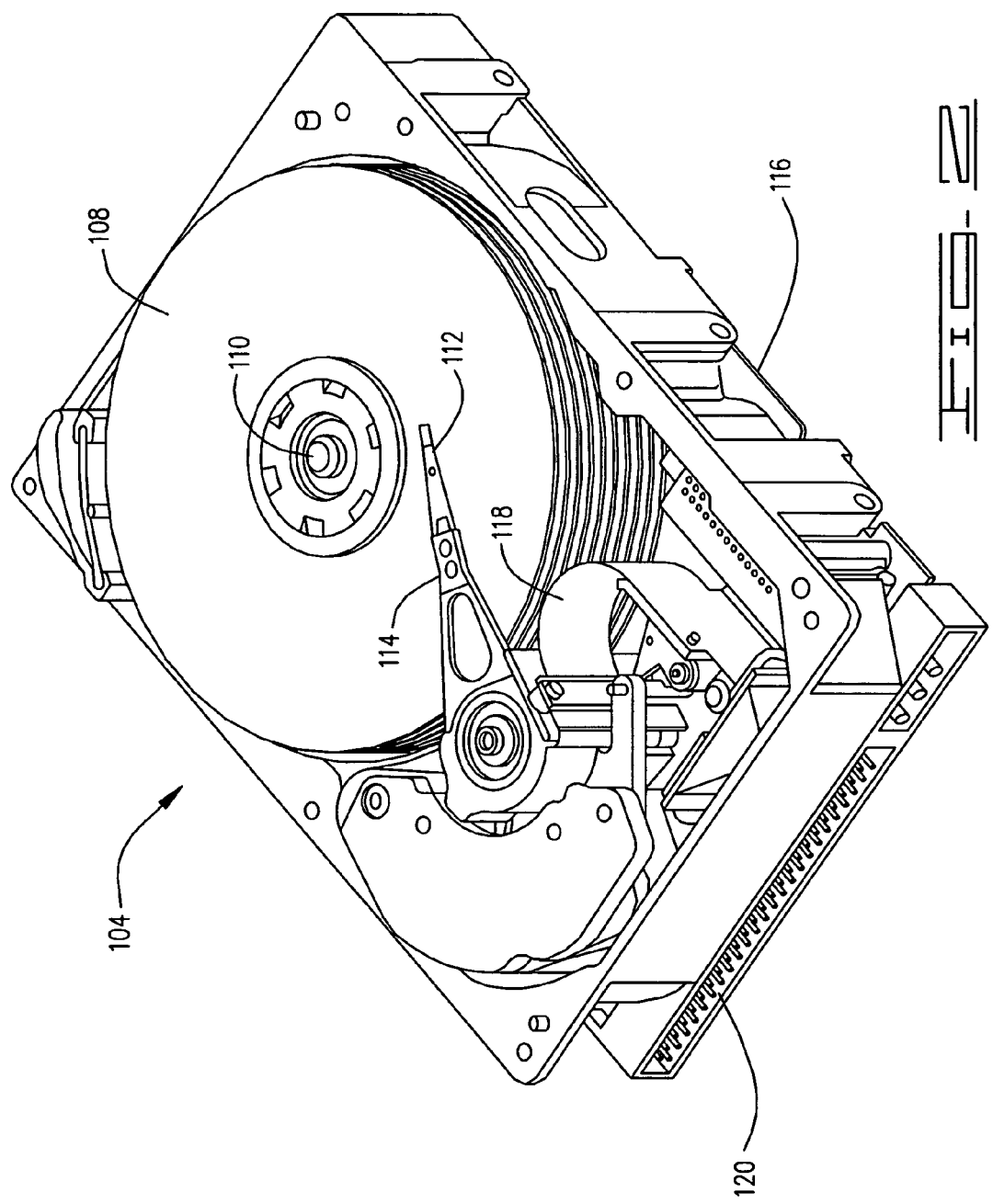
FIG. 2 is an isometric view of a data storage device suited for use in the array storage system of FIG. 1.
Figure 3:
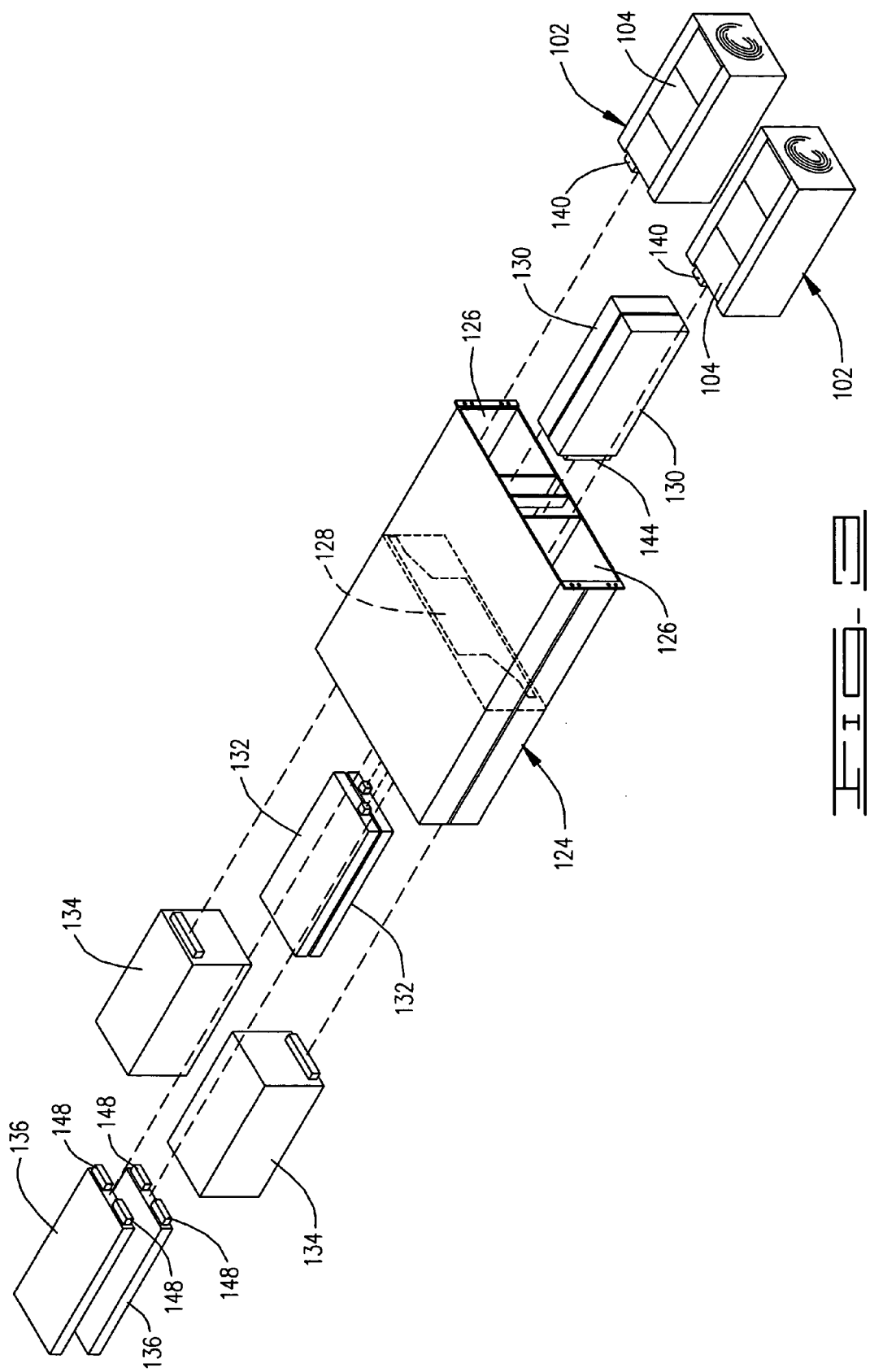
FIG. 3 is an exploded isometric view of portions of the array storage system of FIG. 1.

FIGS. 1-3 illustrate an array storage system ("array") 100 constructed in accordance with novel embodiments of the present invention, wherein a plurality of multiple disc arrays ("MDA") 102 are utilized. An MDA 102 generally comprises a convertible plurality of componentized data storage devices 104. By "convertible" it is meant that one or more data storage devices 104 can be readily replaced, added, or removed in an existing MDA 102, or that a different MDA can be utilized that is capable of supporting a different number, size or arrangement of data storage devices. By "componentized" it is meant that the data storage devices 104 and associated control electronics in the MDA 102 are integrated so as to be functionally presented to the array 100 as a single component.

FIG. 2 is an isometric view of a data storage device 104 suited for use with the present invention and in the form of a rotating magnetic media disc drive. A data storage disc 108 is rotated by a motor 110 to present data storage locations of the disc 108 to a read/write head ("head") 112. The head 112 is supported at the distal end of a rotary actuator 114 that is capable of moving the head 112 radially between inner and outer tracks of the disc 108. The head 112 is electrically connected to a circuit board 116 by way of a flex circuit 118. The circuit board 116 is adapted to receive and send control signals controlling the functions of the data storage device 104. A connector 120 is electrically connected to the circuit board 116, and is adapted for connecting the data storage device 104 with control electronics of the array 100.

A cabinet 122 defines a plurality of cavities into each of which a shelf 124 is receivingly engaged. A host 126 is electrically connected to each of the data storage devices 104 so as to provide a bulk data storage arrangement, such as for providing a network interface and/or for employing data integrity schemes such as in a RAID system. Each shelf 124 defines one or more cavities 126 into each of which an MDA 102 is receivingly engaged for engagement with a backplane 128. Similarly, the shelf 124 defines cavities for receivingly engaging other electrical modules with the backplane 128, such as, but not limited to, controllers 130, batteries 132, power supplies 134, and interfaces 136.

In the illustrative embodiments of FIG. 3, the shelf 124 defines two cavities 126 for receiving two MDAs 102. Equivalent alternative embodiments contemplate a different number of MDAs 102 per shelf 124. The array 100 comprises a plurality of MDAs 102, each sized in accordance with the respective cavity 126 for an operable mating relationship. Each MDA 102 is adapted to operably support a variable number, size, or arrangement of data storage devices 104. More particularly, this solution provides an array 100 comprising a shelf 124 for receivingly engaging an MDA 102 comprising a carrier from a plurality of different carriers, each carrier of the plurality having common exterior dimensions defining an operable mating relationship with the cavity 126 of the shelf 124, and each carrier of the plurality differentiated by interior supporting features for supporting a selected number, size, or arrangement of data storage devices 104.

Figure 4:
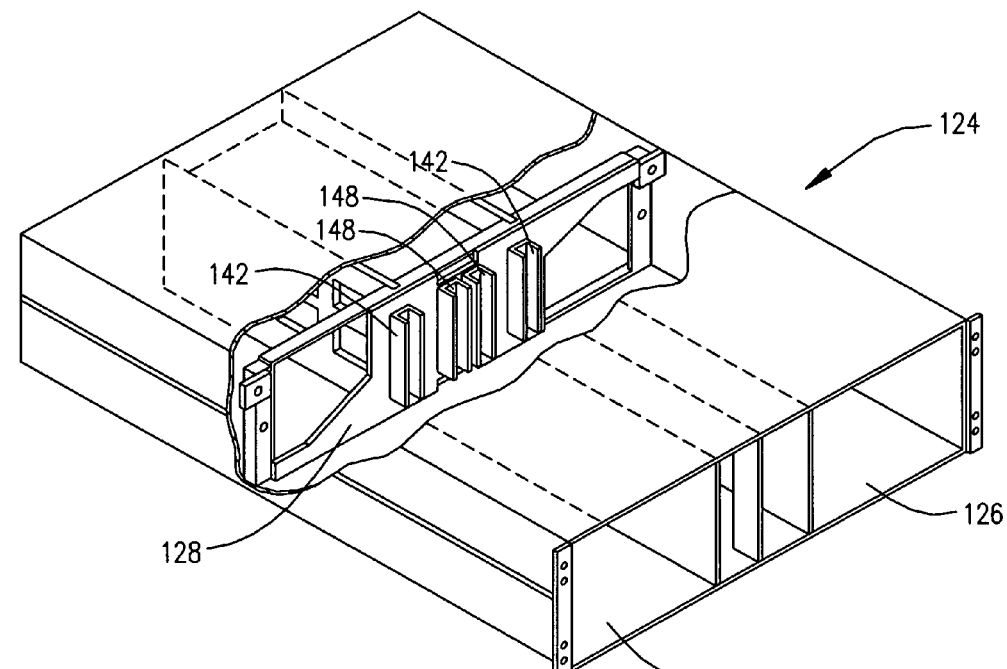
FIGS. 4 and 5 are enlarged isometric views of FIG. 3 showing front and rear projections of the shelf and backplane.
Figure 5:
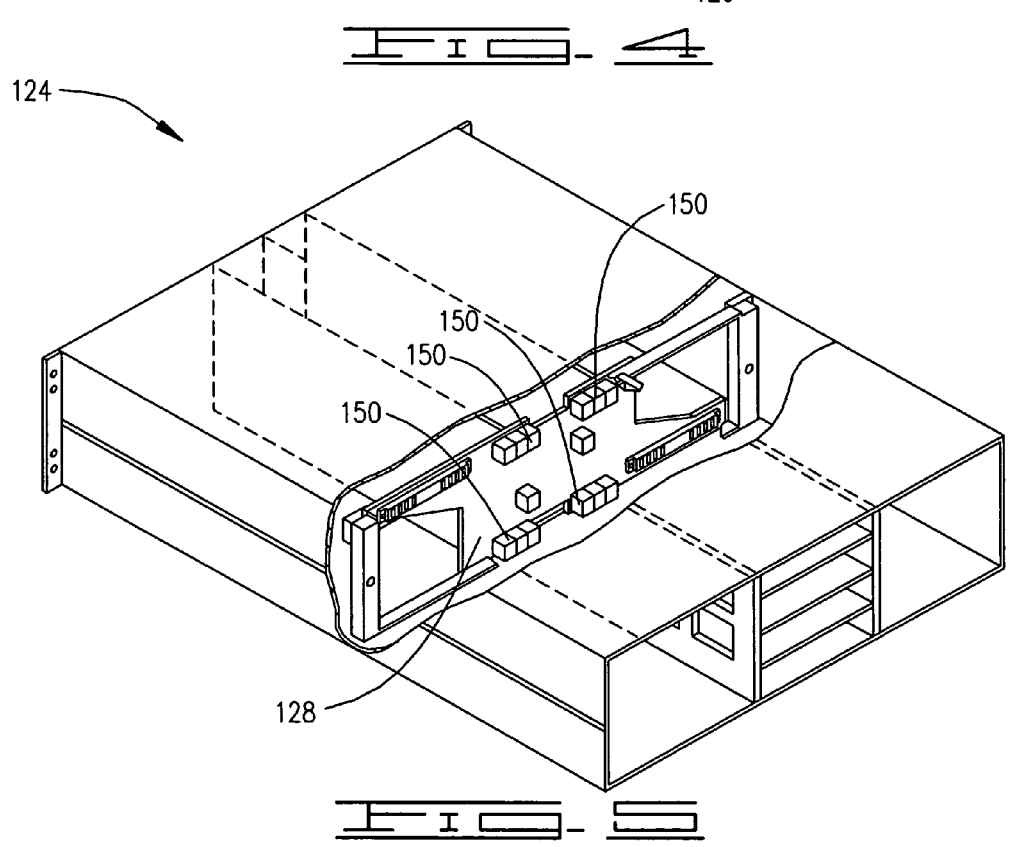

Each of the electronic modules have electrical connectors for electrically communicating with the backplane 128 upon insertion into the shelf 124. Continuing now with FIG. 3 and further considering FIGS. 4 and 5 which are isometric, partially broken away front and rear projections of the shelf 124 and backplane 128. The two MDAs 102 have electrical connectors 140 that connect with mating connectors 142 on the backplane 128. The controllers 130 have electrical connectors 144 that connect with connectors 146 on the backplane 128. The interfaces 136 have electrical connectors 148 that connect with connectors 150 on the backplane 128. All of these electronic modules pass both power and data signals to the backplane 128 for communication with the host 126.

Figure 6:
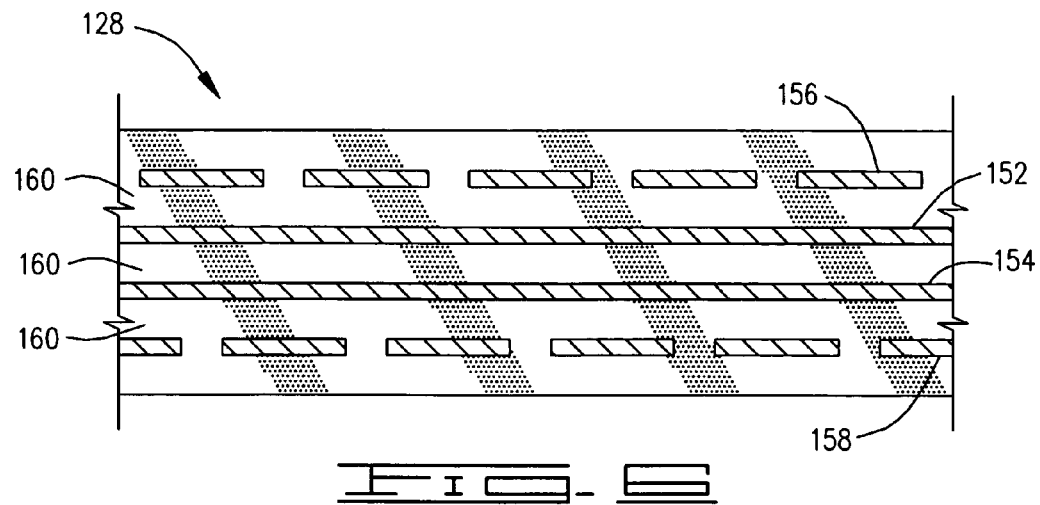
FIG. 6 is a cross sectional view of a portion of the backplane.

FIG. 6 is a cross sectional view of a multi-layer printed circuit board, such as can be used in the backplane 128. A power plane 152 is defined at one layer by a conductive material such as a copper alloy. A ground plane 154 is defined at another layer, with data planes 156, 158 defined in yet other layers. A dielectric material 160 separates the layers, and an insulating material (not shown) can be used between layers where necessary to further reduce noise and cross talk between layers. It will be noted that the power plane 152 and the ground plane 154 are disposed immediately adjacent one another to shorten the associated power ground loops in the circuitry, which reduces ground loop noise.

Figure 7:
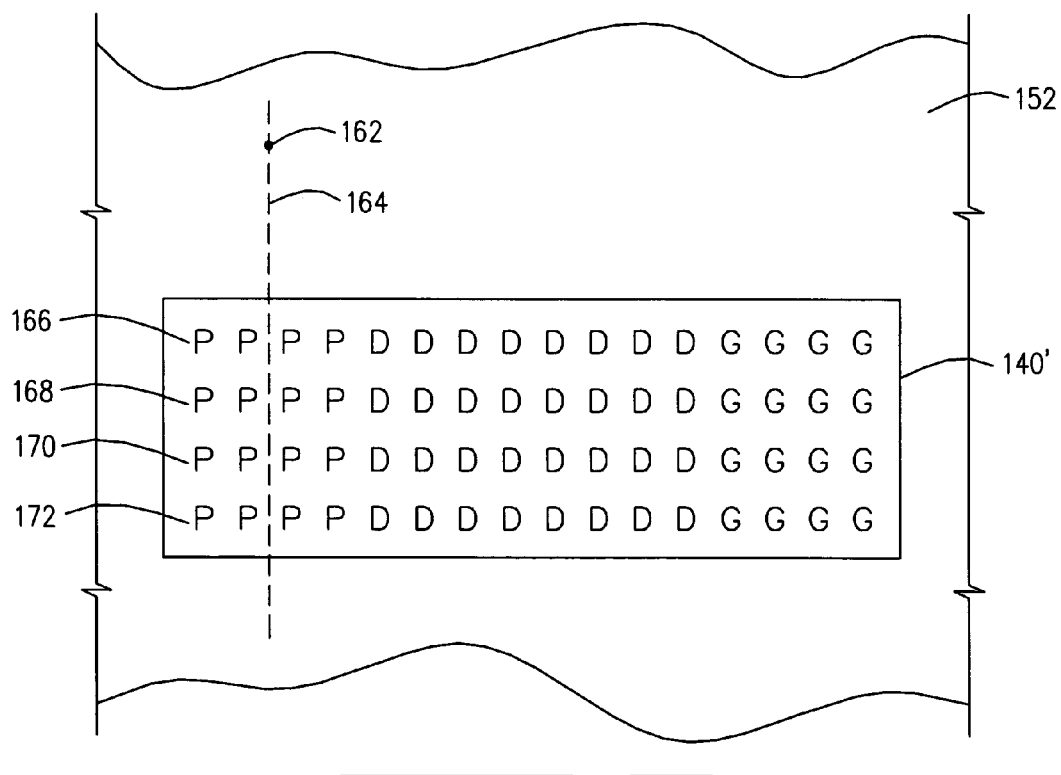
FIG. 7 is a diagrammatic view of a portion of the power plane of FIG. 6 connected to a connector in accordance with a related art embodiment.

FIG. 7 is a diagrammatic view of a related art connector 140' of the MDA 102 connected to a portion of the power plane 152 of the backplane 128. The connector 140' comprises a matrix arrangement of electrical contacts in a bunched arrangement. That is, there is a 4×4 array of power contacts, designated as "P," and a 4×4 array of ground contacts, designated as "G," separated by a 4×8 array of data contacts, designated as "D". In this arrangement, power will not be uniformly distributed among all the power contacts. For example, voltage can be provided to the power plane 152 by way of a power terminal 162 that is optimally located on the perpendicular bisector 164 of the power contact array. Accordingly, relatively more power will be transmitted to the first row 166 of the power contacts than will be transmitted to the other rows 168, 170, 172 where the resistance becomes progressively greater.

Figure 8:
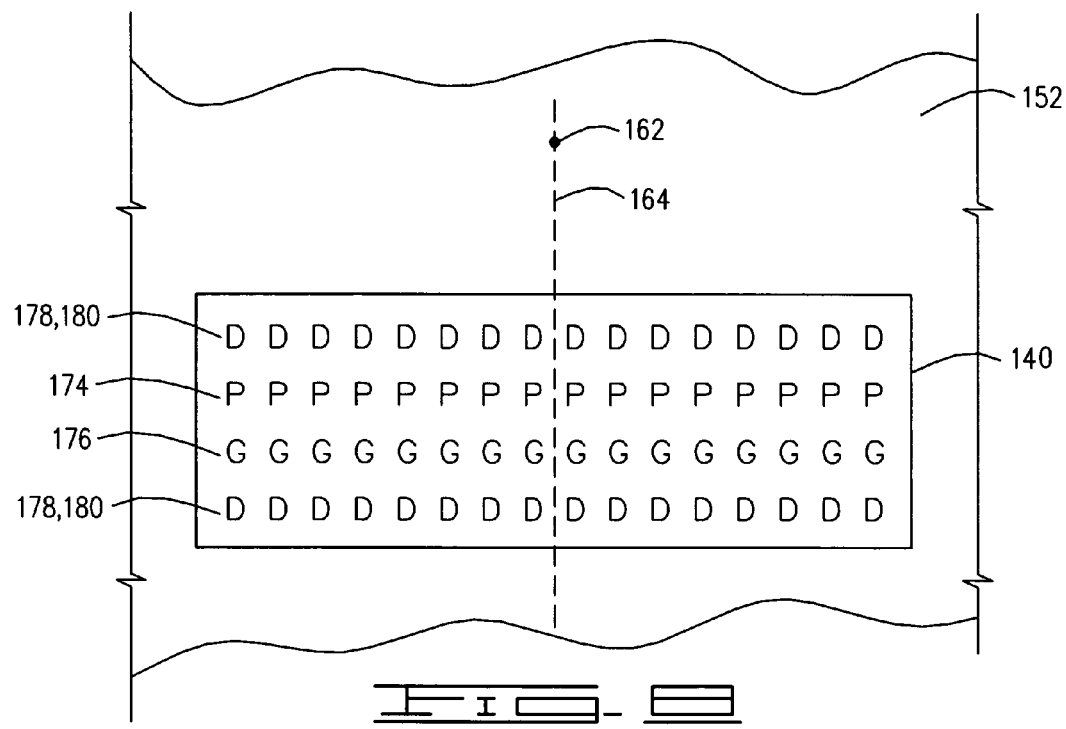
Figure 9:
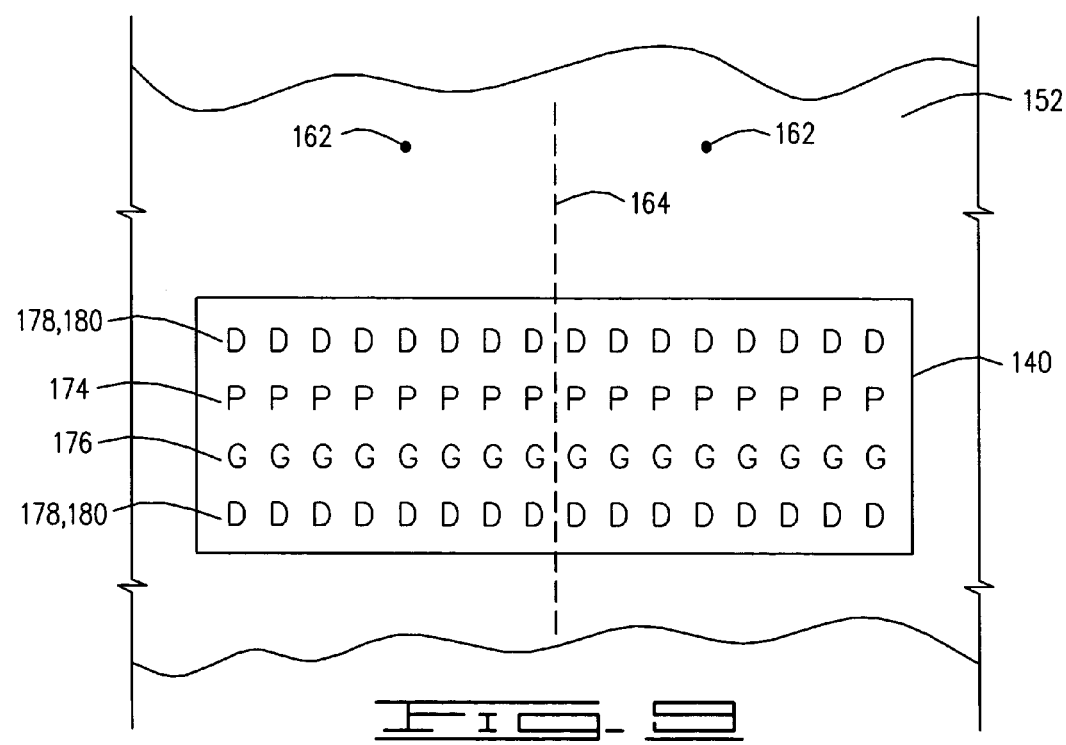

FIG. 8 is a view similar to FIG. 7 but with the connector 140 arranged in accordance with embodiments of the present invention. The connector 140 comprises a plurality of power contacts defining a connector power plane 174 adapted for receiving a substantially even power load distribution from the PCB power plane 152 among the contacts. FIG. 9 illustrates alternative embodiments wherein voltage is provided to the power plane 152 by way of more than one power terminal 162 spaced equally around the perpendicular bisector 164. In either event, the electrical connector 140 comprises a matrix arrangement of electrical contacts, wherein the connector power plane 174 comprises a single row of power contacts.

By way of the equal current and equal impedance of each power contact, the power load is distributed evenly within the power plane 174. Otherwise, in an uneven distribution one or more pins can be overloaded. Also, it will be noted that in the power plane 174, the cross sectional area of power contacts making direct surface contact with the power inputs 162 is about twice that provided by the related art arrangement of FIG. 7. Accordingly, the connector 140 of FIG. 8 is capable of transmitting about twice as much power as the connector 140' of FIG. 7 for a given thickness of copper used to construct the PCB power plane 152.

FIG. 10 illustrates the converse arrangement whereby power flows from the MDA 102 through the power plane 174 to one or more power terminals 182, in the illustrative embodiments three power terminals 182, providing a power supply to other components that are attached to the PCB power plane 152. Other modules in the MDA 102 can be powered by the power supply module 134 in this manner. Whether the power is flowing from or to the MDA 102, as in the illustrative embodiments of FIGS. 8-10, by placing the power contacts 162, 182 on or substantially equally spaced around the perpendicular bisector 164 of the power plane 174, a substantially even power load distribution is established between the PCB power plane 152 and among the power contacts of the power plane 174.

The matrix of electrical contacts further comprises a plurality of ground contacts defining a connector ground plane 176 disposed immediately adjacent and substantially parallel to the connector power plane 174. By "immediately adjacent" it is meant that there are no other contacts medially disposed between adjacent power and ground contacts. In some embodiments the numbers of contactors in the power plane 174 and the ground plane 176 are equivalent, and preferably therein the spacing between each pair of power and ground contacts is substantially constant. The connector 140 further comprises a plurality of data contacts defining a connector data plane 178 disposed immediately adjacent and substantially parallel to a side of the connector power and ground planes. A second plurality of data contacts defines a second connector data plane 180 disposed immediately adjacent and substantially parallel to an opposing side of the connector power and ground planes.

Summarizing, a number of data storage devices (such as 104) are componentized within MDAs (such as 102) for bulk storage and operations in an array storage system (such as 100). The MDA is unitarily removable and insertable in a shelf (such as 124) for electrical communication with a backplane (such as 128) by way of an electrical connection through a connector (such as 140) of the MDA and a connector (such as 142) of the backplane.

The connectors comprising a plurality of power contacts defining a connector power plane (such as 174) adapted for receiving a substantially even power load distribution from the PCB power plane (such as 152) among the power contacts. The electrical connector comprises a matrix arrangement of electrical contacts, wherein the connector power plane can comprise a single row of power contacts.

The matrix can comprise a plurality of ground contacts defining a connector ground plane (such as 176) disposed immediately adjacent and substantially parallel to the connector power plane. In some embodiments the numbers of contactors in the power plane and the ground plane can be equivalent, and a spacing between each pair of power and ground contacts can be substantially constant.

The matrix can further comprise a plurality of data contacts defining a connector data plane (such as 178, 180) disposed immediately adjacent and substantially parallel to one side or both sides of the connector power and ground planes.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular configuration of the PCB power plane and the associated power terminal arrangement without departing from the spirit and scope of the present invention.

What is claimed is:

1. An electronics cabinet comprising:
    an electrical connector in operable electrical communication with a printed circuit board (PCB) power plane via connector power and ground planes defined by a row of a plurality of power contacts commonly connected to the PCB power plane and an immediately adjacent corresponding row of a like plurality of ground contacts, each corresponding power and ground contact set being substantially equally spaced apart; and
    a power terminal contactingly engaging the PCB power plane, for externally communicating power therewith, and disposed symmetrically in relation to a perpendicular bisector axis of the rows.

2. The cabinet of claim 1 wherein the electrical connector comprises a data contact.

3. The cabinet of claim 1 wherein the power terminal contactingly engages the PCB power plane at two different places.

4. An electronic module comprising:
    an electronic connector operably communicating with a PCB power plane via connector power and ground planes defined by a row of a plurality of power contacts commonly connected to the PCB power plane and an immediately adjacent corresponding row of a like plurality of ground contacts, each corresponding power and ground contact set being substantially equally spaced apart; and
    a power terminal contactingly engaging the PCB power plane, for externally communicating power therewith, and disposed symmetrically in relation to a perpendicular bisector axis of the rows.

5. The module of claim 4 wherein the electrical connector comprises a data contact.

6. The module of claim 4 wherein the power terminal contactingly engages the PCB power plane at two different places.

7. In combination:
    a PCB having a PCB power plane and a power terminal contactingly engaging the PCB power plane, for externally communicating power therewith, wherein the power terminal is disposed symmetrically in relation to a perpendicular bisector axis of a linear array of contacts engaging the PCB power plane; and
    a connector operably receiving a substantially even power load distribution from the linear array via connector power and ground planes defined by a row of a plurality of power contacts commonly connected to the PCB power plane and an immediately adjacent corresponding row of a like plurality of ground contacts, each corresponding power and ground contact set being substantially equally spaced apart.

8. The connector of claim 7 wherein the connector comprises a data contact.

* * * * *